United States Patent [19]

Schnable et al.

[11] Patent Number: 4,502,206
[45] Date of Patent: Mar. 5, 1985

[54] METHOD OF FORMING SEMICONDUCTOR CONTACTS BY IMPLANTING IONS OF NEUTRAL SPECIES AT THE INTERFACIAL REGION

[75] Inventors: George L. Schnable, Lansdale, Pa.; Chung P. Wu, Mercerville, N.J.

[73] Assignee: RCA Corporation, New York, N.Y.

[21] Appl. No.: 553,255

[22] Filed: Nov. 18, 1983

[51] Int. Cl.³ .................... H01L 21/265; H01L 7/00
[52] U.S. Cl. ................................ 29/576 B; 29/578; 148/1.5; 148/175; 148/187; 357/65; 357/91
[58] Field of Search .............. 29/576 B, 578; 148/1.5, 148/175, 187; 357/65, 91

[56] References Cited

U.S. PATENT DOCUMENTS

| | | | |
|---|---|---|---|
| 4,071,945 | 2/1978 | Karatsjuba et al. | 29/578 |
| 4,263,518 | 4/1981 | Ballatore et al. | 357/48 |
| 4,330,343 | 5/1982 | Christou et al. | 148/1.5 |
| 4,364,778 | 12/1982 | Leamy et al. | 148/1.5 |

OTHER PUBLICATIONS

Wang et al., J. Vac. Sci Technol., 16 (1979) 130.
Sorimachi et al., Jap. Jour. Appl. Phys. 21, (May 1982), 752.
Hikosaka et al., Radiation Effects 51, (1980), 253.
Nishi et al., in Ion Implantation in Semiconductors Ed., Namba, Plenum, N.Y., 1974, pp. 347-354.
Harris et al., Jour. Appl. Phys. 48, (1977), 2897.
T. J. Faith et al., "Contact Resistance: Al and Al-Si to Diffused N+ and P+ Silicon", J. Vac. Sci. Technol. A1 (2), Apr.-Jun. 1983, 443-448.

Primary Examiner—Upendra Roy
Attorney, Agent, or Firm—Birgit E. Morris; Donald S. Cohen

[57] ABSTRACT

The contact resistance between a layer of conductive material, such as a metal or conductive polycrystalline silicon, and either a body of single crystalline silicon or another layer of the conductive material is reduced by implanting ions of a neutral material through the conductive layer into either the silicon body or the other conductive layer. After the implantation of the neutral ions, the device is annealed.

9 Claims, 5 Drawing Figures

METHOD OF FORMING SEMICONDUCTOR CONTACTS BY IMPLANTING IONS OF NEUTRAL SPECIES AT THE INTERFACIAL REGION

The present invention relates to a method of forming contacts on a semiconductor device, and more particularly to a method of improving the conductivity of such contacts.

BACKGROUND OF THE INVENTION

Contacts to semiconductor devices are generally formed by providing openings in the silicon oxide layer, which is generally over the surface of the silicon substrate, to the area of the substrate surface where contact is to be made. A conductive contact material is then deposited over the silicon oxide layer and in the openings to coat the exposed area of the substrate surface. The contact material may be a metal, such as aluminum, or conductive polycrystalline silicon. If the contact material is aluminum, the device is then generally heated to alloy the contact metal with the silicon of the substrate to form a good ohmic contact. In semiconductor devices which have multi-levels of conductors, such as integrated circuits, contacts are formed between the various levels by the outer level extending through openings in the insulating layer between the levels and making an ohmic contact with the next innermost level.

However, it has been found that the ohmic contact between the conductive layer and the silicon substrate or between various levels of the conductors frequently have higher than desired contact resistance. Where a semiconductor device has a large number of contacts, some of the contacts may have satisfactory low resistance while others may have poor or less than desirable contact resistance. One reason for the poor ohmic contact is the presence of a thin layer of native oxide on the surface of the silicon substrate or the lower level conductor. When the opening is formed in the silicon oxide layer to expose the surface of the silicon substrate or the lower level conductor, the surface of the silicon substrate or the lower level conductor is exposed to the atmosphere and a thin layer of native oxide is formed thereon. Although the exposed surface is generally cleaned by a suitable etchant, the surface is exposed to the atmosphere for a sufficient time between the cleaning and the deposition of the contact material to allow a thin layer of native oxide to form thereon. This native oxide layer acts as an insulator to increase the contact resistance between the contact material and the surface of the silicon substrate or the lower level conductor. When the contact material is a metal which is applied by evaporation or sputtering, another reason for the poor contact resistance is the oxidation of the initially arriving metal atoms during the deposition of the metal. The oxidation of the metal ions is a result of the outgassing of moisture when the shutter is first opened in the evaporator or sputtering system.

SUMMARY OF THE INVENTION

A method of forming an ohmic contact between a conductive material and a surface includes the steps of applying the conductive material to the surface and then implanting ions of a neutral material through the interface between the conductive material and the surface to break up any oxide at the interface and thereby lower the contact resistance between the conductor and the surface upon subsequent annealing of implant damage in the conductive material.

DETAILED DESCRIPTION OF PREFERRED EMBODIMENT

We have found that the contact resistance between a conductive contact layer and either a semiconductor substrate or another conductive contact layer can be reduced by implanting ions of a neutral material through the contact layer and across the interface between the contact layer and either the semiconductor substrate or the other conductive contact layer. The neutral material may be ions of an inactive material such as hydrogen, helium, nitrogen, argon or neon. If the ions are being implanted into a doped semiconductor body or a contact layer of doped polycrystalline silicon, the neutral material may be ions of the same dopant contained in the semiconductor substrate or polycrystalline silicon contact layer. The implantation should be deep enough to cross the interface between the contact layer and the surface on which it is formed, and at a dosage close to or exceeding the dosage needed for amorphization of the material into which it is implanted. Also, the depth of the implantation should be such that the damage to the underlying body is located at or adjacent the interface with the contact layer. We believe that the reduction in contact resistance is achieved by the implanted ions breaking up the native oxide formed at the interface and thus providing greater contact between the contact layer and either the semiconductor substrate or the underlying contact layer. After the implantation, it is preferable to anneal the device at a temperature which will remove any damage caused by the implantation and will further alloy the contact layer to the underlying body. We have found that the alloying temperatures needed to achieve good low resistance contacts after the implantation of the neutral ions is lower than that required to achieve good ohmic contacts without the implantation step. The lower alloying temperatures result in less metal spiking when using metal contact layers and has less effect on the devices already formed in the semiconductor substrate.

Figure 1:
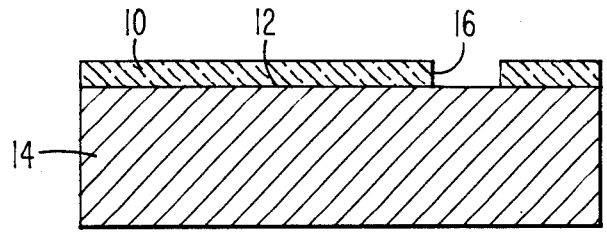
FIGS. 1-3 are sectional views illustrating the steps of the method of the present invention for forming an ohmic contact between a conductive layer and a silicon substrate.
Figure 2:
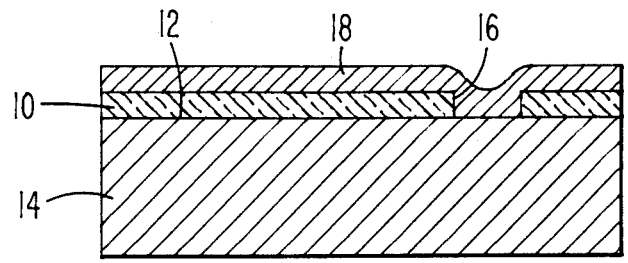
Figure 3:
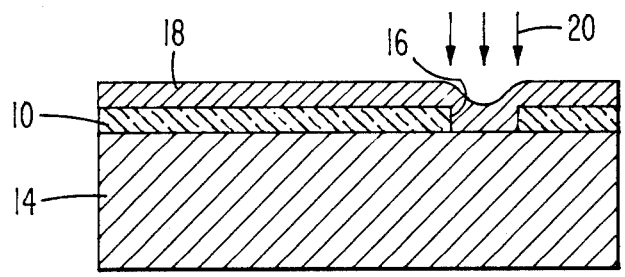

Referring to FIGS. 1 through 3, there is shown the steps of forming a contact on a semiconductor substrate utilizing the method of the present invention. As shown in FIG. 1, a layer 10 of silicon oxide is formed on the surface 12 of a substrate 14 of single-crystalline silicon. The substrate 14 may have formed therein at the surface 12 regions of different conductivity type which form various components, such as field-effect transistors, bipolar transistors, diodes or the like. The silicon oxide layer 10 may be formed by subjecting the substrate surface 12 to an atmosphere of oxygen and/or water vapor at a temperature of about 1000° C. to oxidize the surface 12. The silicon oxide layer 10 is provided with an opening 16 therethrough where a contact to the surface 12 is to be provided. The opening 16 may be formed by coating the silicon oxide layer 10 with a resist, providing openings in the resist layer using standard photolithographic techniques, and then etching the area of the silicon oxide layer 10 exposed by the openings in the resist layer. The portion of the substrate 12 exposed by the opening 16 is then cleaned with a suitable etchant.

As shown in FIG. 2, a layer 18 of a conductive material is then deposited over the silicon oxide layer 10 and in the opening 16 to contact the exposed area of the substrate surface 12. If the conductive layer 18 is of a metal, such as aluminum, it can be applied by the well-known techniques of evaporation in a vacuum or sputtering. If the conductive layer 18 is of polycrystalline silicon, it can be formed by placing the substrate 14 in a chamber, passing silane through the chamber and heating the substrate to a temperature at which the silane decomposes to form the silicon which is deposited on the substrate 14. The conductive layer 18 can be deposited directly as polycrystalline silicon or can be deposited as amorphous silicon which is then heated to convert it to polycrystalline silicon. The polycrystalline silicon layer 18 can be made conductive by doping it with phosphorus by passing $POCl_3$ through the chamber at 950° C. for about 15 minutes.

The conductive layer 18 is then subjected to the bombardment of ions of a neutral material as indicated by the arrows 20 in FIG. 3. The ions are bombarded against the conductive layer 18 at sufficient energy to cause the ions to pass through the conductive layer 18 and the interface between the conductive layer 18 and the substrate surface and become implanted in the substrate 14. The particular energy used to implant the ions in the substrate 14 depends on the particular ions used and the thickness of the conductive layer 18. The larger the ion and/or the thicker the conductive layer 18, the greater the energy that must be used. To limit the ions to the area of the opening 16, the conductive layer 18 may be coated with a thick layer of a resist except where the opening 16 is located. If the silicon oxide layer 10 is of sufficient thickness to prevent the ions from passing therethrough, a resist masking layer may not be required. After implanting the ions, the device is heated to remove any damage resulting from the implantation and, where the conductive layer 18 is of a metal, to alloy the metal conductive layer to the silicon substrate. The conductive layer 18 can then be defined using standard photolithographic techniques to form it into a desired pattern of conductive lines.

Figure 4:
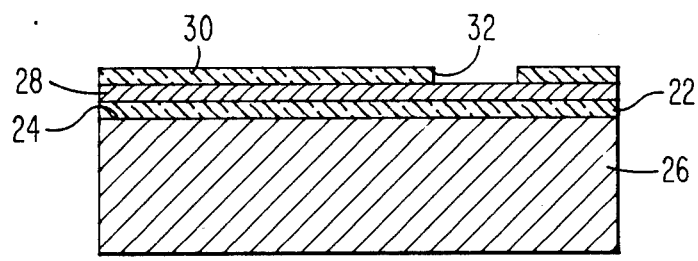
FIGS. 4 and 5 are sectional views illustrating the steps of the method of the present invention for forming an ohmic contact between two layers of conductive material.
Figure 5:
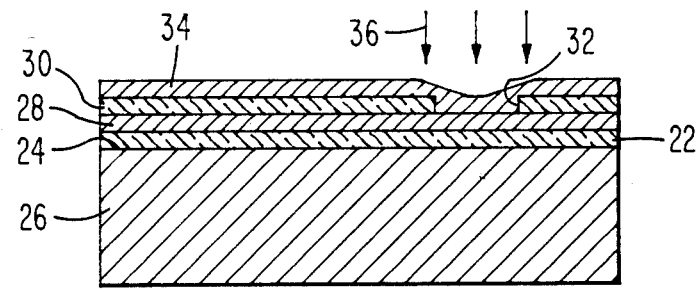

Referring to FIGS. 4 and 5, there is shown a method of making a semiconductor device having multilevels of interconnected conductive lines. The method includes forming a layer 22 of silicon oxide on the surface 24 of a substrate 26 of single-crystalline silicon. The substrate 26 may have formed therein at the surface 24 regions of different conductivity types which make up various electrical components. The silicon oxide layer 22 may be formed by heating the substrate 26 in air and/or water vapor at 1000° C. A layer 28 of a conductive material is formed on the silicon oxide layer 22. The conductive layer 28 may be of a metal, such as aluminum, or of conductive polycrystalline silicon. The silicon oxide layer 22 may have an opening therethrough (not shown) through which the conductive layer 28 extends to make contact with the surface of the substrate 26. A layer 30 of an insulating material is then formed over the conductive layer 28. The insulating layer 30 may be of silicon oxide, silicon nitride or a plastic, such as a polyimide. The insulating layer 30 is provided with an opening 32 therethrough using standard photolithographic techniques. As shown in FIG. 5, a second conductive layer 34 is coated over the insulating layer 30 and in the opening 32 to make contact with the first conductive layer 28. The second conductive layer 34 is generally of the same material as that of the first conductive layer 28. The second conductive layer 34 is then bombarded with ions of an inactive material as indicated by arrows 36. The ions are directed against the second conductive layer 34 with sufficient energy that the ions pass through the second conductive layer 34, across the interface between the second conductive layer 34 and the first conductive layer 28 and become embedded in the first conductive layer 28. The device is then heated to anneal out any damage caused by the implanted ions, and for conductive layers of a metal, to alloy the two conductive layers together.

The following examples further illustrate the present invention and are not to be taken as in any way restricting the invention beyond the scope of the appended claims.

EXAMPLE I

A test device was made which included a wafer of single-crystal silicon of P-type conductivity having a channel of N+ type conductivity diffused therein along one surface. A layer of silicon oxide covered the surface of the wafer including the channel. A plurality of square contact openings were formed in the silicon oxide layer to the channel. The contact openings were spaced along the channel. Some of the contact openings were 5 micrometers square and some were 3 micrometers square. A layer of aluminum was coated over the silicon oxide layer and in the contact openings to contact the surface of the wafer along the channel. The aluminum film was defined into a pattern of strips which extended transversely across the channel with each strip extending into a separate contact opening. Such a test device is shown and described in the article of T. J. Faith et al., entitled "Contact Resistance: Al and Al—Si to Diffused N+ and P+ Silicon", published in the Journal of Vacuum Science and Technology, Al (2), April–June 1983, pgs. 443–448.

After the strips were formed, the contact resistance between each strip and the wafer was measured as described in the Faith et al. article. The wafer was then annealed at 425° C. for 30 minutes and then at 450° C. for 30 minutes. The contact resistance was measured again after each annealing. The wafer was then subjected to an implantation of $H_2^+$ at 275 KeV and a dosage of $2 \times 10^{15}/cm^2$. The wafer was then annealed at 250° C. for 30 minutes and then at 300° C. for 30 minutes. The contact resistance between each strip and the wafer was measured immediately after implantation and after each annealing. Table I shows each of the resistance measurements for each of the five micrometer contacts to the substrate, and Table II shows each of the resistance measurements for each of the three micrometer contacts.

TABLE I

| Contact Resistance (ohms) (5 micrometer contact openings) | | | | | |
|---|---|---|---|---|---|
| As Deposited | Annealed 425° C. | Annealed 450° C. | Implanted with $H_2^+$ | Annealed 250° C. | Annealed 300° C. |
| $1.0 \times 10^4$ | 160 | 70 | 224 | 25 | 36 |

TABLE I-continued

Contact Resistance (ohms)
(5 micrometer contact openings)

| As Deposited | Annealed 425° C. | Annealed 450° C. | Implanted with $H_2^+$ | Annealed 250° C. | Annealed 300° C. |
|---|---|---|---|---|---|
| $1.6 \times 10^4$ | 160 | 48 | 137 | 19 | 26 |
| $1.5 \times 10^4$ | 160 | 72 | 215 | 24 | 34 |
| $1.7 \times 10^4$ | 190 | 74 | 244 | 21 | 31 |
| $1.0 \times 10^4$ | 150 | 66 | 252 | 21 | 36 |
| $1.7 \times 10^4$ | 160 | 55 | 133 | 22 | 30 |
| $1.5 \times 10^4$ | 210 | 80 | 177 | 23 | 34 |
| $1.5 \times 10^4$ | 160 | 76 | 159 | 22 | 33 |
| $1.5 \times 10^4$ | 140 | 68 | 145 | 22 | 31 |
| $1.9 \times 10^4$ | 200 | 110 | 228 | 26 | 37 |
| $1.4 \times 10^4$ | 160 | 68 | 173 | 24 | 32 |
| $1.5 \times 10^4$ | 140 | 72 | 230 | 25 | 32 |
| $1.7 \times 10^4$ | 140 | 80 | 254 | 25 | 31 |

TABLE II

Contact Resistance (ohms)
(3 micrometer contact openings)

| As Deposited | Annealed 425° C. | Annealed 450° C. | Implanted with $H_2^+$ | Annealed 250° C. | Annealed 300° C. |
|---|---|---|---|---|---|
| $1.2 \times 10^5$ | $6.9 \times 10^4$ | $7.7 \times 10^3$ | 14775 | 4501 | 44 |
| $4.9 \times 10^4$ | 890 | 330 | 760 | 71 | 116 |
| $5.1 \times 10^4$ | 1100 | 210 | 573 | 71 | 98 |
| $4.6 \times 10^4$ | 1000 | 440 | 896 | 65 | 126 |
| $4.5 \times 10^4$ | 980 | 220 | 594 | 72 | 112 |
| $5.1 \times 10^4$ | 1300 | 440 | 1156 | 74 | 136 |
| $8.3 \times 10^4$ | 4600 | 620 | 1468 | 249 | 348 |
| $4.8 \times 10^4$ | 930 | 180 | 404 | 68 | 91 |
| $5.2 \times 10^4$ | 1300 | 530 | 1285 | 87 | 181 |
| $5.0 \times 10^4$ | 1400 | 500 | 1622 | 102 | 154 |
| $5.0 \times 10^4$ | 1000 | 340 | 829 | 76 | 120 |
| $4.9 \times 10^4$ | 960 | 490 | 1500 | 81 | 110 |
| $5.7 \times 10^4$ | 1300 | 530 | 1394 | 96 | 159 |

EXAMPLE II

A test device was made as described in Example I except that a layer of doped polycrystalline silicon instead of a layer of aluminum was deposited over the oxide layer. The device was then subjected to an implantation of $H_2^+$ at 90 KeV and a dosage of $1 \times 10^{15}/cm^2$ and annealed at 850°, C. for 30 minutes. The contact resistance for each strip was again measured. The device was then annealed at 950° C. for 30 minutes and the contact resistance for each strip was again measured. Table III shows each of the contact resistance measurements for each 5 micrometer contact and Table IV shows the contact resistance for each three micrometer contact.

TABLE III

Contact Resistance (ohms)
(5 micrometer contact openings)

| Pre-implantation | Implanted with $H_2^+$ Annealed at 850° C. | Annealed at 950° C. |
|---|---|---|
| 503 | 52 | 880 |
| 401 | 863 | 193 |
| 299 | 80 | 450 |
| 1929 | 257 | 856 |
| 65 | 326 | 62 |
| 357 | 55 | 322 |
| 495 | 496 | 554 |
| 109 | 169 | 194 |
| 898 | 308 | 84 |
| 188 | 624 | 719 |
| 699 | 127 | 255 |
| 434 | 765 | 103 |
| 122 | 428 | 113 |
| 1150 | 372 | 785 |
| 278 | 587 | 54 |
| 302 | 471 | 11 |
| 1292 | 245 | 859 |
| 847 | 252 | 299 |
| 167 | 291 | 127 |
| 385 | 529 | 144 |
| 993 | 52 | 199 |

TABLE IV

Contact Resistance (ohms)
(3 micrometer contact openings)

| Pre-implantation | Implanted with $H_2^+$ Annealed at 850° C. | Annealed 950° C. |
|---|---|---|
| 268 | 38 | 31 |
| 40.2 | 64 | 884 |
| 81 | 27 | 4 |
| 19 | 270 | 12 |
| 71 | 705 | 39 |
| 65 | 539 | 40 |
| 58 | 334 | 41 |
| 48 | 66 | 17 |
| 40 | 93 | 6 |
| 71 | 504 | 24 |
| 30 | 63 | 22 |
| 1042 | 119 | 668 |
| 301 | 711 | 59 |
| 65 | 35 | 15 |
| 41 | 139 | 595 |
| 61 | 44.5 | 60 |
| 36 | 872 | 49 |
| 56 | 158 | 572 |
| 62 | 73 | 11 |
| 60 | 596 | 58 |

EXAMPLE III

A test device was made as described in Example I using aluminum as the outer layer which was defined to form the contact strips. After the strips were annealed at 450° C. for 30 minutes, the resistance for each contact was measured. The device was implanted with $H_2^+$ ions at 260 KeV and at a dosage of $2 \times 10^{15}/cm^2$ and then annealed at 250° C., 350° C., 400° C. and 450° C. each for 30 minutes. The resistance for each contact was measured after each annealing. Table V shows each of the resistances measured for each 5 micrometer contact and Table VI shows each of the resistances measured for each 3 micrometer contact.

TABLE V

Contact Resistance (ohms)
(5 micrometer openings)

| Pre-Implantation | Implantation with $H_2^+$ Annealed at 250° C. | Annealed 350° C. | Annealed 400° C. | Annealed 450° C. |
|---|---|---|---|---|
| 9.4 | 12.1 | 12.2 | 12.1 | 10.2 |
| 9.2 | 13.0 | 13.4 | 12.4 | 10.3 |
| 8.9 | 12.4 | 12.8 | 12.7 | 10.9 |
| 10.0 | 14.4 | 16.8 | 15.0 | 11.7 |
| 9.5 | 13.8 | 14.4 | 23.6 | 11.2 |
| 9.0 | 12.9 | 13.2 | 12.9 | 10.9 |
| 8.8 | 10.8 | 11.4 | 11.7 | 10.7 |
| 8.7 | 11.2 | 11.8 | 11.9 | 11.4 |
| 8.7 | 10.6 | 11.6 | 11.8 | 11.5 |
| 9.1 | 10.5 | 11.8 | 11.9 | 11.5 |
| 8.6 | 10.9 | 11.8 | 11.9 | 11.7 |
| 9.2 | 10.8 | 12.0 | 12.4 | 11.7 |
| 12.2 | 10.7 | 16.4 | 14.3 | 12.1 |
| 9.7 | 8.9 | 11.0 | 11.0 | 9.8 |
| 9.2 | 8.5 | 10.0 | 10.1 | 9.7 |
| 9.0 | 8.6 | 10.7 | 10.2 | 9.7 |

TABLE V-continued

| | Contact Resistance (ohms) (5 micrometer openings) | | | |
|---|---|---|---|---|
| Pre-Im-plantation | Implantation with $H_2^+$ Annealed at 250° C. | Annealed 350° C. | Annealed 400° C. | Annealed 450° C. |
| 10.1 | 9.2 | 11.0 | 10.8 | 11.0 |
| 9.8 | 8.8 | 10.4 | 9.9 | 9.9 |
| 9.3 | 11.2 | 12.4 | 13.7 | 11.2 |
| 9.4 | 7.3 | 8.2 | 10.0 | 10.2 |
| 9.8 | 11.1 | 12.7 | 13.7 | 12.0 |
| 9.5 | 10.7 | 12.1 | 13.0 | 11.1 |
| 9.6 | 11.4 | 12.3 | 13.7 | 11.7 |
| 9.3 | 10.7 | 11.5 | 12.3 | 11.4 |

TABLE VI

| | Contact Resistance (ohms) (3 micrometer openings) | | | |
|---|---|---|---|---|
| Pre-Im-plantation | Implantation with $H_2^+$ Annealed at 250° C. | Annealed 350° C. | Annealed 400° C. | Annealed 450° C. |
| 22.4 | 29.2 | 33.8 | 27.0 | 19.9 |
| 20.2 | 29.6 | 27.4 | 25.5 | 21.8 |
| 22.1 | 28.8 | 28.0 | 27.1 | 20.8 |
| 22.4 | 34.8 | 34.8 | 33.8 | 26.9 |
| 21.4 | 34.3 | 35.2 | 32.8 | 22.9 |
| 20.3 | 29.3 | 29.3 | 30.8 | 22.5 |
| 20.0 | 25.9 | 30.9 | 34.2 | 25.8 |
| 20.8 | 26.7 | 27.8 | 28.1 | 24.5 |
| 19.4 | 22.9 | 26.8 | 26.8 | 20.9 |
| 18.6 | 21.8 | 26.3 | 28.5 | 24.2 |
| 22.2 | 25.6 | 30.2 | 31.4 | 24.2 |
| 20.3 | 25.5 | 25.3 | 26.5 | 23.7 |
| 24.5 | 29.7 | 50.5 | 39.7 | 29.9 |
| 27.2 | 23.6 | 33.0 | 26.7 | 22.6 |
| 23.6 | 20.9 | 30.2 | 25.7 | 21.6 |
| 26.6 | 23.3 | 33.2 | 28.2 | 22.4 |
| 29.5 | 25.8 | 32.1 | 29.3 | 27.2 |
| 26.5 | 22.9 | 32.0 | 27.9 | 25.3 |
| 23.9 | 26.3 | 31.0 | 36.4 | 23.4 |
| 24.3 | 15.1 | 20.4 | 25.3 | 22.2 |
| 24.0 | 25.2 | 28.3 | 33.3 | 28.8 |
| 24.9 | 22.9 | 27.4 | 33.3 | 24.4 |
| 20.6 | 23.9 | 25.1 | 31.5 | 23.7 |
| 23.1 | 25.5 | 31.2 | 35.5 | 24.5 |

EXAMPLE IV

A test device was made by coating the surface of a wafer of single crystalline silicon with a layer of silicon oxide. A first layer of aluminum was then deposited on the silicon oxide layer. The first aluminum layer was defined to form a plurality of small, spaced, rectangular islands arranged in a row. A second layer of silicon oxide was deposited on the first aluminum islands. Square openings, 3 micrometers on each side, were formed in the second silicon oxide layer with each opening extending to a separate one of the first aluminum islands adjacent an end of the islands so that each of the first aluminum islands had two openings extending therethrough with one opening being at each end thereof. A second layer of aluminum was coated over the second silicon oxide layer and in each of the openings to contact the first aluminum islands. The second aluminum layer was defined into spaced, aligned, rectangular islands each of which extends over the space between two adjacent first islands, overlaps the end portions of the two adjacent first islands and extends into the openings in the silicon oxide layer to contact each of the two adjacent first islands. This provides a series connection between the first aluminum islands and the second aluminum islands. The contact resistance between each of the second aluminum islands and each of the first aluminum islands was measured. Then the device was subjected to an implant of $^1H^+$ at 130 KeV and a dosage of $4 \times 10^{15}/cm^2$ and then annealed at 250° C. for 30 minutes. After again measuring each of the contact resistances, the device was subjected to a second anneal at 450° C. for 30 minutes and the contact resistance was again measured. Table VII lists each of the measured contact resistances.

TABLE VII

| | Contact Resistance (milliohms) (3 micrometer openings) | |
|---|---|---|
| Pre-implantation | Implanted with $^1H^+$ Annealed at 250° C. | Annealed at 450° C. |
| 3.8 | 3.2 | 3.4 |
| 3.6 | 3.0 | 3.2 |
| 3.6 | 3.0 | 3.0 |
| 3.0 | 2.6 | 2.8 |
| 4.6 | 4.0 | 4.2 |
| 4.2 | 3.6 | 4.0 |
| 3.4 | 2.8 | 3.2 |
| 3.4 | 2.8 | 2.8 |
| 2.4 | 1.8 | 2.4 |
| 1.6 | 2.0 | 2.2 |
| 3.0 | 2.4 | 2.6 |
| 3.2 | 2.6 | 2.8 |
| 2.9 | 2.4 | 2.6 |
| 4.0 | 3.6 | 3.6 |
| 4.0 | 3.6 | 3.8 |
| 2.6 | 2.6 | 2.6 |
| 3.4 | 3.0 | 2.4 |
| 2.6 | 2.2 | 2.4 |
| 2.8 | 2.2 | 2.2 |
| 2.6 | 2.2 | 2.6 |
| 2.8 | 2.6 | 2.8 |
| 5.0 | 4.6 | 4.8 |
| 3.0 | 2.6 | 2.8 |
| 2.6 | 2.2 | 2.4 |
| 1.6 | 1.4 | 1.4 |
| 3.2 | 2.4 | 2.6 |
| 3.2 | 2.8 | 2.8 |

From Tables I and II in Example I, it can be seen that for a contact between aluminum and single crystalline silicon, implanting hydrogen ions through the contact and then annealing the contact lowers the resistance of the contact. From Tables V and VI of Examples III, it can be seen that if the aluminum to silicon contact initially has a low contact resistance, i.e. there is a good contact formed initially, implanting the contact with hydrogen ions does not change the resistance of the contact very much either upwardly or downwardly. Therefore, if a semiconductor device having a plurality of aluminum to silicon contacts, some of which are good and some bad, is implanted with hydrogen ions and annealed, the contact resistance of the bad contacts will be improved whereas there will be little change to the contact resistance of the good contacts. Thus, the method of the present invention will improve the poor contacts without adversely affecting the good contacts.

From Tables III and IV of Example II, it can be seen that the contact resistance of a polycrystalline silicon to silicon contact can also be improved by implanting the contact with hydrogen and annealing. Although the improvements in contact resistance in the test of this example are not as consistent as in the test of Example I, reduced contact resistance was obtained in many of the contacts. Some of the contacts were so poor initially that the method of the present invention could not improve them. Also, some of the contacts required higher annealing temperatures to achieve the reduction in the contact resistance than was required by other of the contacts.

From Table VII of Example IV, it can be seen that the contact resistance of an aluminum-to-aluminum contact can also be reduced by implanting the contact with hydrogen ions and then annealing. Thus, there is provided by the present invention a method of improving the contact resistance between a conductive material and a body of single crystalline silicon or the contact resistance between two layers of a conductive material. When the semiconductor device contains a plurality of contacts, some of which are good and some poor, the method of the present invention can improve the poor contacts without adversely affecting the good contacts.

We claim:

1. A method of forming an ohmic contact between a layer of a conductive material and a body of a conductive material which tends to oxidize in air comprising the steps of
    applying the layer of conductive material to a surface of said conductive body, and
    implanting ions of a neutral material through the interface between the conductive material layer and the surface of the body to break up any oxide at the interface and thereby lower the contact resistance between the conductive layer and the body.

2. A method in accordance with claim 1 wherein after the ions are implanted, the conductive layer and the body are annealed.

3. A method in accordance with claim 2 wherein the conductive body is of single crystalline silicon.

4. A method in accordance with claim 3 including forming a layer of silicon oxide on the surface of the silicon body, forming an opening in said silicon oxide layer and applying the conductive layer on said silicon oxide layer and in said opening to contact the surface of the body.

5. A method in accordance with claim 4 in which the conductive layer is of a metal.

6. A method in accordance with claim 5 in which the conductive layer and body are annealed at a temperature at which any damage to the body by the implantation is removed and the metal conductive layer is alloyed with the silicon body.

7. A method in accordance with claim 4 in which the conductive layer is of polycrystalline silicon.

8. A method in accordance with claim 3 in which the ions are implanted at an energy which causes the ions to extend through the conductive layer and become imbedded in the silicon body adjacent the interface between the conductive layer and the silicon body and at a dosage close to or exceeding that needed to amorphize the silicon body.

9. A method in accordance with claim 1 in which the conductive body is a layer of the same material as that of the conductive layer.

* * * * *